US006077327A

United States Patent [19]

Hamayoshi et al.

[11] Patent Number: 6,077,327

[45] Date of Patent: Jun. 20, 2000

[54] ALUMINUM COMPOSITE MATERIAL OF LOW-THERMAL EXPANSION AND HIGH-THERMAL CONDUCTIVITY AND METHOD OF PRODUCING SAME

[75] Inventors: Shigeyuki Hamayoshi; Satoshi Fukui; Kenichiro Shimizu; Masahiko Ohshima, all of Kitakyushu, Japan

[73] Assignee: Hitachi Metals, Ltd., Tokyo, Japan

[21] Appl. No.: 08/821,073

[22] Filed: Mar. 20, 1997

[30] Foreign Application Priority Data

Mar. 29, 1996 [JP] Japan .................................... 8-075744

[51] Int. Cl.$^7$ .................................................... C22C 21/00

[52] U.S. Cl. ................................ 75/332; 75/228; 75/229; 75/230; 75/233; 75/236

[58] Field of Search .............................. 75/332, 228, 229, 75/230, 233, 236

[56] References Cited

U.S. PATENT DOCUMENTS

| | | | |
|---|---|---|---|
| 4,017,480 | 4/1977 | Baum | 428/601 |
| 4,472,351 | 9/1984 | Gonczy | 419/46 |
| 4,921,655 | 5/1990 | Sterzel | 264/66 |
| 4,954,170 | 9/1990 | Fey et al. | 75/229 |
| 5,384,087 | 1/1995 | Scorey | 419/10 |

FOREIGN PATENT DOCUMENTS

| | | | |
|---|---|---|---|
| 64-83634 | 3/1989 | Japan | C22C 1/09 |
| 7-26174 | 3/1995 | Japan | C22C 29/06 |
| 1381445 | 1/1975 | United Kingdom | C22C 21/20 |

*Primary Examiner*—Patrick Ryan
*Assistant Examiner*—M. Alexandra Elve
*Attorney, Agent, or Firm*—Sughrue, Mion, Zinn, Macpeak & Seas, PLLC

[57] ABSTRACT

There is disclosed a method of producing an aluminum composite material in which the content of silicon carbide can be made higher as compared with conventional methods, and the production cost is low, and the method can be carried out easily. An aluminum composite material of low-thermal expansion and high-thermal conductivity is produced by this method. A mixture of powder of aluminum metal or an alloy thereof and silicon carbide powder is pressurized and compacted to form a green compact. Subsequently, this green compact is charged into a mold, and is heated and compacted into a predetermined shape at a temperature not less than a melting point of the aluminum metal or the alloy thereof.

3 Claims, No Drawings

ALUMINUM COMPOSITE MATERIAL OF LOW-THERMAL EXPANSION AND HIGH-THERMAL CONDUCTIVITY AND METHOD OF PRODUCING SAME

BACKGROUND OF THE INVENTION

1. Field of the Invention

This invention relates to an aluminum composite material having a low thermal expansion coefficient and high thermal conductivity, and also relates to a method of producing such an aluminum composite material. The aluminum composite material of the present invention is suitable for a heat sinking plate or the like used in a semiconductor device.

2. Related Art

Recently, in the semiconductor field, the capacity of transistors has been much increased, and LSIs have been formed into a highly-integrated, high-speed and high-performance design, and thus the performance of the semiconductor devices has been improved markedly. Therefore, it has now been important to dissipate thermal energy, produced from semiconductor devices, to a heat sinking plate as efficiently as possible. With respect to conventional heat sinking plate materials for semiconductor devices, copper (Cu) has been used for a substrate (or base plate), molybdenum (Mo) for a large-size substrate, a plastics material or alumina ($Al_2O_3$) for a package, and aluminum nitride (AlN) for a large-capacity package.

In the conventional heat sinking plate materials, copper, which has high thermal conductivity of 390 W/(m·K) at normal or ordinary temperature, is excellent in heat-radiating property. However, there is a large difference in thermal expansion coefficient between copper and silicon (Si) used as a semiconductor material for forming a transistor and an LSI chip (Silicon has a thermal expansion coefficient of $4.2\times10^{-6}$/K while copper has a thermal expansion coefficient of $17\times10^{-6}$/K). Therefore, there is a problem that a solder bonding surface of Pb—Sn or the like, formed between the heat sinking plate and the semiconductor device, is separated by thermal stresses applied repeatedly during the operation of the associated circuit. In contrast, molybdenum has a thermal expansion coefficient of $5.1\times10^{-6}$/K close to that of the semiconductor device, and therefore provides an excellent reliability at the solder bonding surface. However, there is another problem that molybdenum does not possess an adequate heat-radiating property since it has low thermal conductivity of 150 W/(m·K). AlN is a well-balanced ceramics material because its thermal conductivity is 170 W/(m·K), and its thermal expansion coefficient is $4.5\times10^{-6}$/K. However, AlN has still another problem that it is costly, and therefore is disadvantageous from an economical point of view. Besides, each of these conventional materials is composed of a single material, and therefore it is difficult to arbitrarily control the two properties (that is, the thermal expansion coefficient and the thermal conductivity).

On the other hand, Japanese Patent Examined Publication No. 7-26174 discloses an auxiliary electronic part material as a new heat sinking plate material for semiconductors, which material is composed of aluminum or an aluminum alloy and green colour silicon carbide. Japanese Patent Unexamined Publication No. 64-83634 discloses a low-thermal expansion, high-heat radiating aluminum composite material consisting of at least one selected from the group consisting of aluminum nitride, silicon carbide, boron nitride and graphite, and aluminum. However, these heat sinking plate materials do not have sufficient thermal conductivity.

For example, thermal conductivity of an aluminum composite material (disclosed in Japanese Patent Unexamined Publication No. 64-83634) containing 60% by volume of silicon carbide has thermal conductivity of 119 W/(m·K) (see Table 3), and therefore is not sufficient in heat-radiating property. A composite material (disclosed in Japanese Patent Examined Publication No. 7-26174) containing 50% by volume of green colour silicon carbide has thermal conductivity of 170 W/(m·K) (see Table 1), and if it is desired to obtain thermal conductivity of not less than 150 W/(m·K), it is impossible to increase the silicon carbide content to not less than 60% by volume. Namely, in the conventional heat sinking plate materials, the range of choice of the silicon carbide content is narrow, and is not sufficient to meet the thermal expansion coefficient of the semiconductor materials.

There is known a method of producing an aluminum composite material containing silicon carbide, in which a porous preform of silicon carbide is forcibly impregnated under pressure with molten aluminum. In this method, however, the size of an apparatus becomes large, and therefore the production cost is high, and a yield rate is low since a riser is required, and much time and labor are required for preventing leakage of the molten material. Particularly when producing a small-size product, it is difficult to effect a net shape compacting, and there is encountered a problem that a crack is liable to develop in the preform because of the use of a high pressure.

SUMMARY OF THE INVENTION

With the above problems in view, it is an object of this invention to provide a method of producing an aluminum composite material in which the content of silicon carbide can be made higher as compared with conventional materials, the production cost of which is low, and which method can be carried out easily.

Another object of the invention is to provide an aluminum composite material having a low thermal expansion coefficient and high thermal conductivity.

According to one aspect of the present invention, there is provided a method of producing an aluminum composite material of low-thermal expansion and high-thermal conductivity, comprising the steps of: pressurizing and compacting a mixture of powder of aluminum metal or an alloy thereof and silicon carbide powder to form a green compact; subsequently charging the green compact into a mold; and heating and compacting the green compact at a temperature not less than a melting point of the powder of the aluminum metal or the alloy thereof. In the method of the invention, a covering layer composed of the aluminum metal or aluminum alloy may be formed on the surface of a resultant compact simultaneously when or after the heating and compacting are performed.

According to another aspect of the invention, there is provided a method of producing a low-thermal expansion, high-thermal conductivity aluminum composite material, comprising the steps of: filling surfaces of a mass of a mixture powder of both aluminum or aluminum alloy powder and silicon carbide powder with powder of aluminum metal or an alloy thereof of the same kind as that of the first-mentioned aluminum metal or aluminum alloy, and pressurizing and compacting the powder mixture to form a green compact; subsequently charging the green compact into a mold; heating and compacting the green compact at a temperature not less than a melting point of the powder of the aluminum metal or the aluminum alloy; and forming a covering layer composed of the aluminum or aluminum alloy of the same kind.

According to a further aspect of the invention, there is provided a method of producing an aluminum composite material of low-thermal expansion and high-thermal conductivity, comprising the steps of: pressurizing and compacting a mixture powder of aluminum metal or aluminum alloy powder and silicon carbide powder to form a green compact; subsequently charging the green compact into a mold so that aluminum metal or its alloy of the same kind as that of the first-mentioned aluminum metal or alloy thereof is in contact with a surface of the green compact; heating and compacting the green compact at a temperature not less than a melting point of the powder of the aluminum metal or the alloy thereof while forming a covering layer composed of the aluminum or aluminum alloy of the same kind. In this case, the aluminum metal or the alloy thereof contacted with the surface of the green compact may be in the form of at least one selected from the group consisting of powder, a plate, a bar, a lump and a foil.

In the above methods of the invention, the powder mixture may consist of 80 to 10% by volume of the powder of the aluminum metal or the alloy thereof, and 20 to 90% by volume of the silicon carbide powder added thereto.

Preferably, in the powder mixture, the ratio (X/Y) of a particle size X of the silicon carbide powder to a particle size Y of the powder of the aluminum metal or the alloy thereof is more than 1.

The particles of the silicon carbide powder may be pseudospherical shape close to a spherical shape. Preferably, the aspect ratio of the silicon carbide powder is 1 to 5.

The silicon carbide powder is a blend of coarse powder and fine powder different in particle size from each other. The ratio (Xa/Xb) of a particle size Xa of the coarse powder of the silicon carbide powder to a particle size Xb of the fine powder is not less than 2.

The silicon carbide powder is granulation powder. The silicon carbide powder is a blend of granulation powder and simple powder (which means particles which are not granulated, that is, which simple powder is defined by powder having a single particle size distribution, not having coarse and fine powder distributions). In this case, the particle size of the granulation powder of the silicon carbide is not less than 10 μm. The shortest distance among the adjacent granulation powder particles is not more than ½ of the particle size of the granulation powder.

The relative density of the green compact after the heating and compacting is not less than 50%. After charging into a mold the green compact obtained by pressurizing and compacting the powder mixture, the green compact is heated and compacted in a nonoxidation atmosphere. Alternatively, after charging into a mold the green compact obtained by pressurizing and compacting the powder mixture, the green compact may be heated and compacted by hot pressing or hydrostatic pressurizing. A compacted product thus obtained is subjected to hot working.

The aluminum composite material of low-thermal expansion and high-thermal conductivity produced by any one of the above methods of the invention has a thermal expansion coefficient of $4\times10^{-6}$/K to $20\times10^{-6}$/K and thermal conductivity of 150 to 280 W/(m·K). This composite material has a porosity of not more than 10%.

DESCRIPTION OF PREFERRED EMBODIMENTS

Preferably, aluminum metal or powder of its alloy (these will hereinafter often referred to as "aluminum powder") has a particle size of 10 to 300 μm, and more preferably 20 to 100 μm, and most preferably 30 to 50 μm. The content of the aluminum powder with respect to the total volume of the raw powder material is 80 to 10% by volume. If the content of the aluminum powder is more than 80 vol. %, the thermal expansion coefficient becomes too high, and in contrast if this content is less than 10 vol. %, the thermal conductivity becomes too low, and therefore these are not desirable. Examples of such aluminum powder include Al—Si alloy, Al—Si—Mg alloy, and Al—Cu alloy.

The content of silicon carbide powder with respect to the total volume of the raw powder material is 20 to 90% by volume. If the content of the silicon carbide powder is more than 90 vol. %, the thermal conductivity becomes too low, and in contrast if this content is less than 20 vol. %, the thermal expansion coefficient becomes too high, and therefore these are not desirable.

The aluminum powder and the silicon carbide powder are mixed together in the above ratio. The mixing can be carried out by any suitable conventional method. For example, the mixing can be effected using a ball mill. Preferably, a mixing time is not less than 3 hours. Then, the powder mixture is pressurized and compacted to form a green compact of a desired shape. Examples of the pressurizing and compacting method include a metal mold pressing method, and a CIP method.

The green compact thus obtained is charged into a mold, and is heated at a temperature not less than a melting point of the aluminum powder, and is compacted into a desired shape. In the case of the aluminum metal, its melting point is about 660° C. Preferably, in the compacting method, the material is heated in a nonoxidation atmosphere, and is subjected to hydrostatic pressurizing or hot pressing.

In the case of a green compact having a low compacting density (, which is liable to occur particularly when the silicon carbide content is high), the molten aluminum flows into gaps among the silicon carbide powder particles or particles during the heating and compacting operation, so that the whole of a compact contracts or shrinks. At this time, the spacing among the silicon carbide powder particles need to be reduced, however, the higher the silicon carbide content is, the more the silicon carbide powder particles are liable to have a bridging state with the result that it becomes difficult for the spacing to shrink. Therefore, when producing the green compact, the amount of the aluminum powder is beforehand reduced, and the compacting of the powder mixture is effected to form the green compact so that the spacing of the silicon carbide powder particles is reduced, and at the time of heating and compacting the green compact, a required amount of aluminum is caused to flow into the material so as to replenish aluminum. This method is effective particularly when producing the composite material of which silicon carbide content is high.

In one example of this method, powder of aluminum of the same kind as that of the aluminum in the powder mixture is first supplied into the mold of pressurizing and compacting purposes, and then the powder mixture is supplied on the layer of this aluminum powder, and then the aluminum powder of the same kind is supplied on this powder mixture, and these powders are pressurized and compacted to form a green compact of a three-layer construction, and then this green compact is put into the mold for heating and compacting purposes, and is heated and compacted into the predetermined shape.

In another example of method, the powder mixture is previously compacted to form a green compact. Then, an aluminum material of the same kind as that of the aluminum in the powder mixture is first supplied into the mold used for heating and compacting purposes, and then the green compact is supplied onto the layer of this aluminum material, and then an aluminum material of the same kind is supplied on the green compact, and these are heated and compacted. This aluminum material may be in any suitable form such as powder, a plate, a bar, a lump (or ingot) and a foil.

In these methods, as a result of replenishing the aluminum, a covering layer, which is rich in aluminum, is formed on the surface of a compact simultaneously with the heating and compacting. This covering layer facilitates the formation of plating on the surface of the composite material, and besides enhances workability.

The thus obtained composite material has a thermal expansion coefficient of $4\times10^{-6}$/K to $20\times10^{-6}$/K and thermal conductivity of 150 to 280 W/(m·K). If the porosity of this composite material is more than 10%, the thermal conductivity is lowered, and therefore the porosity is preferably not more than 10%, and more preferably not more than 8%.

In the present invention, particularly when producing the aluminum composite material with a high silicon carbide content, attention has been directed to the morphology of the silicon carbide powder and the aluminum powder, the filling density of the powder, a shape retention property of the green compact, and wettability of the green compact.

When aluminum powder and silicon carbide are mixed together, and this powder mixture is pressurized and compacted by a metal mold press, CIP or other method, the aluminum, which is softer than the silicon carbide, is plastically worked to serve as a binder, so that the green compact, having a good shape retention property, can be produced. Therefore, depending on the particle size ratio of the aluminum powder to the silicon carbide powder, the dispersion state of the aluminum powder, serving as the binder, varies. By making the particle size of the silicon carbide powder larger than the particle size of the aluminum powder, the strength and density of the green compact can be enhanced. Preferably, the ratio (X/Y) of the particle size X of the silicon carbide powder to the particle size Y of the aluminum powder is more than 1, and more preferably 2 to 10, and most preferably 5 to 10.

If the above ratio X/Y is not more than 1 (that is, the particle size of the silicon carbide powder is not larger than the particle size of the aluminum powder), the silicon carbide powder intrudes in a network-like manner into gaps among the aluminum powder particles, thus causing a bridging condition with the result that the aluminum is less liable to be deformed during the pressurizing and compacting operation, so that the density of the green compact can not be sufficiently increased. In contrast, if the ratio X/Y is more than 1 (that is, the particle size of the silicon carbide powder is larger than the particle size of the aluminum powder), the aluminum powder intrudes in a network-like manner into gaps among the silicon carbide particles, and the aluminum is sufficiently contracted during the heating and compacting, so that the density of the compacted product can be enhanced.

Preferably, the silicon carbide powder has a pseudospherical shape close to a spherical shape, and have less sharp edges. With such spherical shape, the powder can be filled at a higher density, and besides the molten aluminum can more easily flow into the gaps among the silicon carbide powder particles during the heating and compacting. Namely, the wettability for the aluminum is enhanced, so that the occurrence of pores can be suppressed. The sphering of the silicon carbide powder particles can be achieved by granulating the silicon carbide particles, or by gradually grinding corners of silicon carbide pulverization powder into a spherical shape by the use of a ball mill or a planetary ball mill. The planetary ball mill, though expensive, can form the powder particles into a spherical shape in a shorter time.

Preferably, the aspect ratio of the silicon carbide powder is in the range of from 1 to 5. If the aspect ratio is larger than 5, it is difficult to disperse the silicon carbide powder into the aluminum matrix at a rate of a high volume %. More preferably, the aspect ratio is in the range of from 1 to 3. Preferably, the silicon carbide powder is a blend of coarse powder and fine powder which are different in particle size from each other, since such blended silicon carbide powder can be filled at a higher density. In this case, the ratio (Xa/Xb) of the particle size Xa of the coarse powder of the silicon carbide powder to the particle size Xb of the fine powder is not less than 2, and more preferably 5 to 10.

Preferably, granulation powder is used as the silicon carbide powder. When the granulation powder is used, porous silicon carbide particles, having a shape close to a spherical shape, can be obtained, and upon contact with molten aluminum, these porous particles draw the aluminum thereinto because of a capillary phenomenon. By utilizing this force, the molten aluminum can be infiltrated into the silicon carbide under no pressure. Although the aluminum powder is plastically worked during the pressurizing and compacting, it will not intrude into the granulation powder of the silicon carbide, and pores remain between the powders. When the green compact in this condition is heated and compacted, the molten aluminum flows not only into the pores between the powders but also into the granulation powder of the silicon carbide. When the silicon carbide is dispersed at a rate of a high volume %, the flow of the molten aluminum and the spacing among the silicon carbide particles are both liable to vary if the silicon carbide is not granulation powder, but if the silicon carbide is granulation powder, the spacing among the adjacent silicon carbide particles hardly varies. Namely, when the granulation powder is dispersed, the dispersed state of the silicon carbide after the heating and compacting operation can be made hardly different from the dispersed state of the silicon carbide in the green compact, and therefore in this case the control is easier.

In the case where granulation powder is used as the silicon carbide powder, the particle size thereof is preferably not less than 10 $\mu$m. Upon contact with the molten aluminum, the granulation powder draws the aluminum thereinto by a capillary phenomenon, and therefore if the spacing among the adjacent granulation powder particles is large, pores are formed at those regions where the aluminum powder has originally existed. In order to suppress the formation of these pores, it is necessary to increase the rate of filling of the aluminum powder and also to reduce the spacing among the adjacent granulation powder particles as much as possible. Therefore, preferably, the granulation powder is so dispersed as the shortest distance among the adjacent granulation powder particles is not more than ½ of the particle size of the granulation powder particles.

If the relative density of the green compact after the pressurizing and compacting is less than 50%, the satisfactory shape retention property can not be maintained, and the compacting is difficult. Therefore, the relative density of the green compact is needed to be not less than 50%.

EXAMPLE

Aluminum metal and its alloy powder used in the examples were in the form of atomization powder. As aluminum powder, there were prepared a powder having a purity of not less than 99.9% and an average particle size of 30 μm and another powder having a purity of not less than 99.9% and an average particle size of 150 μm. In Example No. 9 shown in Tables 1 and 2 below, Al-12%Sn having an average particle size of 30 μm was prepared as aluminum alloy powder.

As silicon carbide powder, there were used a pulverization powder obtained by pulverizing a reaction sintered product, a spherical powder obtained by sphering the pulverization powder for 6 hours in a rotating planetary ball mill, and a granulation powder obtained by granulating silicon carbide powder having an average particle size of about 3 μm. As the pulverization powder of silicon carbide, there were prepared a powder having an average particle size of 60 μm and another powder having an average particle size of 300 μm. As the spherical powder of silicon carbide, there were prepared a powder having an average particle size of 30 μm and another powder having an average particle size of 300 μm. As the granulation powder of silicon carbide, there were prepared a powder having an average particle size of 30 μm, another powder having an average particle size of 35 μm, and still another powder having an average particle size of 300 μm.

The aluminum powder and the silicon carbide powder were blended together in the ratio (volume %) shown in Table 1, and were dry mixed for 24 hours in a ball mill to prepare a powder mixture. In Example Nos. 7 to 15, a blend of coarse powder and fine powder different in particle size from each other was used as the silicon carbide powder. The coarse powder and the fine powder were blended in the ratio of 70 vol. % and 30 vol. %.

For example, the silicon carbide powder of Example No. 7 was prepared by blending pulverization powder with an average particle size of 300 μm and pulverization powder with an average particle size of 30 μm, and the silicon carbide powder of Example No. 15 was prepared by blending spherical powder with an average particle size of 300 μm and pulverization powder with an average particle size of 30 μm.

Then, the mixture of the aluminum powder and the silicon carbide powder was supplied into a mold, and was pressurized and compacted at a pressure of 5 ton/cm$^2$ by a mold press to form a green compact having a diameter of 80 mm and a height of 6 mm. In the samples of Example No. 5 to 15 containing 75 vol. % silicon carbide powder, aluminum powder of the same kind as that of the aluminum in the powder mixture was supplied on each of upper and lower sides of the powder mixture having such a reduced amount of aluminum powder so that the spacing among the adjacent silicon carbide particles was reduced, and in this condition these powders were pressurized and compacted.

Then, the green compact was charged into a mold made of a graphite, and was heated so as to increase its temperature at a rate of about 100° C./hour, and then was maintained at 700 to 750° C. for 1 hour, and then was cooled. The mold should be made of a material not reacting with aluminum, such as graphite and ceramics.

TABLE 1

| No. | powder mixture vol. % Al:SiC | Al powder Average particle size (μm) | SiC powder Average particle size (μm) | SiC powder Form |
|---|---|---|---|---|
| 1 | 60:40 | 30 | 60 | Pulverization powder |
| 2 | 60:40 | 30 | 60 | Pulverization powder |
| 3 | 60:40 | 30 | 60 | Pulverization powder |
| 4 | 60:40 | 150 | 60 | Pulverization powder |
| 5 | 25:75 | 30 | 60 | Pulverization powder |
| 6 | 25:75 | 30 | 300 | Pulverization powder |
| 7 | 25:75 | 30 | 300, 30 | Pulverization powder, Pulverization powder |
| 8 | 25:75 | 30 | 300, 30 | Spherical powder, Spherical powder |
| 9 | 25:75 | 30 | 300, 30 | Spherical powder, Spherical powder |
| 10 | 25:75 | 30 | 300, 35 | Granulation powder, Granulation powder |
| 11 | 25:75 | 30 | 300, 35 | Granulation powder, Granulation powder |
| 12 | 25:75 | 30 | 300, 30 | Granulation powder, Spherical powder |
| 13 | 25:75 | 30 | 300, 30 | Granulation powder, Spherical powder |
| 14 | 25:75 | 30 | 300, 30 | Spherical powder, Granulation powder |
| 15 | 25:75 | 30 | 300, 30 | Spherical powder, Granulation powder |

Properties of each green compact as well as properties of each compact were examined. The density of each green compact was measured by measuring its weight and dimensions and then by comparing these with a theoretical weight. Results are shown in Table 2.

The density of each compact was measured by cutting a square test piece (each side: 10 mm; height: 2 mm) from the compact and then by measuring the density of the test piece in accordance with an Archimedean method. Results are shown in Table 2.

The thermal conductivity of each compact was measured by cutting a test piece (diameter: 10 mm; height: 2 mm) from the compact and then by measuring the thermal conductivity of the test piece by the use of a thermal constant measurement device (LF/TCM-FA8510B, manufactured by Rigaku Denki K. K.) in accordance with a laser flash method (in conformity to JIS1606). Results are shown in Table 2.

The thermal expansion coefficient of each compact was measured by cutting a square test piece (each side: 3 mm; length: 17 mm) and then by measuring the thermal expansion coefficient of the test piece in a temperature range of from ordinary temperature to 100° C. by the use of a TMA (thermomechanical analyzer, manufactured by Seiko K.K.). Results are shown in Table 2.

TABLE 2

| No. | Density of green compact (%) | Atmosphere during compacting | Density compacts (%) | Thermal conductivity of compacts (W/m · K) | Thermal expansion coefficient of compacts ($\times 10^{-6}$) |
|---|---|---|---|---|---|
| 1 | 93 | Vacuum | 98 | 205 | 13.2 |
| 2 | 93 | Nitrogen | 97 | 201 | 13.4 |
| 3 | 93 | Argon | 98 | 203 | 13.1 |
| 4 | 75 | Vacuum | Unmeasurable | Unneasurable | Unneasurable |
| 5 | Unmeasurable | No Compacting | — | — | — |
| 6 | 70 | Vacuum | Unmeasurable | Unmeasurable | Unmeasurable |
| 7 | 75 | Vacuum | 75 | Unmeasurable | Unmeasurable |
| 8 | 85 | Vacuum | 90 | 130 | 7.3 |
| 9 | 78 | Vacuum | 82 | 80 | 7.5 |
| 10 | 76 | Vacuum | 93 | 184 | 7.1 |
| 11 | 76 | Nitrogen | 95 | 189 | 7.1 |
| 12 | 80 | Vacuum | 97 | 192 | 7.0 |
| 13 | 80 | Nitrogen | 96 | 184 | 7.1 |
| 14 | 85 | Vacuum | 96 | 187 | 7.1 |
| 15 | 85 | Nitrogen | 97 | 191 | 7.0 |

In Table 2, "unmeasurable" means that the measurement could not be carried out due to the collapse of the shape of the compact, or that pores in the compact were present too many to perform the measurement.

In the method of producing the aluminum composite material of low-thermal expansion and high-thermal conductivity provided in accordance with the present invention, the content of the silicon carbide can be increased as compared with the conventional methods, and the aluminum powder serves as the binder so as to achieve a good shape retention, and the dispersion of the silicon carbide can be controlled from the green compact to the compacted product.

The aluminum composite materials obtained by the production method of the present invention have the following advantageous effects. By suitably selecting the content (vol. %) of the aluminum metal particles or its alloy particles (serving as the matrix) and the content of the silicon carbide particles, the thermal expansion coefficient and the thermal conductivity can be controlled to their respective desired characteristics.

The aluminum composite material can have a thermal expansion coefficient close to that of a semiconductor material mounted on the heat sinking plate, and therefore the solder bonding face between the heat sinking plate and the semiconductor material can be maintained without separation which is caused by thermal stresses, so that the reliability of the solder bonding face is enhanced.

Since the matrix is composed of the aluminum metal or its alloy, the high thermal conductivity can be obtained, and therefore thermal energy occurring from the semiconductor material can be efficiently dissipated, thereby preventing transistor chips, LSI chips and the like from being subjected to malfunction and thermal damage.

What is claimed is:

1. A method of producing an aluminum composite material of low-thermal expansion and high-thermal conductivity, comprising the steps of: filling surfaces of a mass of a mixture powder of both a powder of aluminum metal or an alloy thereof and a silicon carbide powder with another powder of aluminum metal or aluminum alloy of the same kind as that of said first-mentioned aluminum metal or alloy thereof; pressurizing and compacting said powder mixture to form a green compact; subsequently charging said green compact into a mold; and heating and compacting said green compact at a temperature not less than a melting point of the powder of the aluminum metal or the alloy thereof to thereby form a compact while forming a covering layer composed of the filled aluminum or aluminum alloy of the same kind.

2. A method of producing an aluminum composite material of low-thermal expansion and high-thermal conductivity, comprising the steps of: pressurizing and compacting a mixture of powder of aluminum metal or an alloy thereof and silicon carbide powder to form a green compact; and subsequently charging said green compact into a mold so that aluminum metal or its alloy of the same kind as that of said first-mentioned aluminum metal or aluminum alloy is in contact with surfaces of said green compact, and heating and compacting said green compact at a temperature not less than a melting point of the powder of the aluminum metal or the alloy thereof while forming a covering layer composed of the aluminum or aluminum alloy of the same kind.

3. A method according to claim 2, in which the aluminum metal or the alloy thereof contacted with the surface of the green compact is in the form of at least one selected from the group consisting of powder, a plate, a bar, a lump and a foil.

* * * * *